United States Patent [19]

Sasaki et al.

[11] Patent Number: 4,545,647

[45] Date of Patent: Oct. 8, 1985

[54] RESILIENT INTERCONNECTION FOR EXCHANGEABLE LIQUID CRYSTAL PANEL

[75] Inventors: Takehiko Sasaki, Yamatokoriyama; Tamotsu Koyama, Kashiwara, both of Japan

[73] Assignee: Sharp Kabushiki Kaisha, Osaka, Japan

[21] Appl. No.: 520,224

[22] Filed: Aug. 5, 1983

Related U.S. Application Data

[63] Continuation of Ser. No. 379,002, May 17, 1982, abandoned, which is a continuation of Ser. No. 940,388, Sep. 7, 1978, abandoned, which is a continuation of Ser. No. 619,974, Sep. 30, 1975, abandoned.

[30] Foreign Application Priority Data

Sep. 30, 1974 [JP] Japan .................................. 113142

[51] Int. Cl.⁴ .............................................. G02F 1/13
[52] U.S. Cl. .................................. 350/331 R; 350/336
[58] Field of Search .................. 350/334, 336, 331 R, 350/334

[56] References Cited

U.S. PATENT DOCUMENTS

| 2,885,459 | 5/1959 | Pulsifer et al. | 174/35 GC |
| 3,795,037 | 3/1974 | Luttmer | 339/59 M X |
| 3,861,135 | 1/1975 | Seeger, Jr. et al. | 58/50 R |
| 3,863,436 | 2/1975 | Schwarzschild et al. | 58/50 R |
| 3,883,213 | 5/1975 | Glaister | 350/334 X |
| 3,991,463 | 11/1976 | Squitieri et al. | 350/334 X |
| 4,012,117 | 3/1977 | Lazzery | 350/331 R |
| 4,142,780 | 3/1979 | Sasaki et al. | 350/334 |

FOREIGN PATENT DOCUMENTS 2407738 8/1974 Fed. Rep. of Germany ... 339/17 M

OTHER PUBLICATIONS

"Becon Printed Circuit Connector", Brown Engineering Co., Huntsville, Alabama, rec'd Dec. 7, 1961.
"Tecknit Conductive Elastomeric Connector", Data Sheet CEC-011 of Technical Wire Products, Santa Barbara, Calif. (Jul. 1974).
Buchoff, L. S., "Conductive Elastomers Make Small, Flexible Contacts", *Electronics,* (Sep. 19, 1974) pp. 122-125.

Primary Examiner—John K. Corbin
Assistant Examiner—Richard F. Gallivan
Attorney, Agent, or Firm—Birch, Stewart, Kolasch & Birch

[57] ABSTRACT

Compressible interconnection is removably provided between a liquid crystal panel and a circuit board or a semiconductor chip to provide exchangeability for the liquid crystal panel from the viewpoint of the limited operating life inherent in liquid crystal composites. A desired number of electrodes for electrical connection are provided on both the liquid crystal panel and the circuit board to confront each other. The compressible interconnection means comprises a stack including a multiplicity of compressible and resilient conductive regions made of, for example, conductive rubber and a multiplicity of compressible, resilient non-conductive regions made of, for example, rubber in alternate fashion. The conductive regions connect the electrodes provided on the liquid crystal panel with the electrodes provided on the circuit board. The section of the conductive region is selected smaller than the distance provided between two adjacent electrodes on the liquid crystal panel and the circuit board, and the distance between two adjacent conductive regions is selected shorter than the width of the electrodes provided on the liquid crystal panel and the circuit board, thereby facilitating the installation and exchanging of the liquid crystal panel.

3 Claims, 8 Drawing Figures

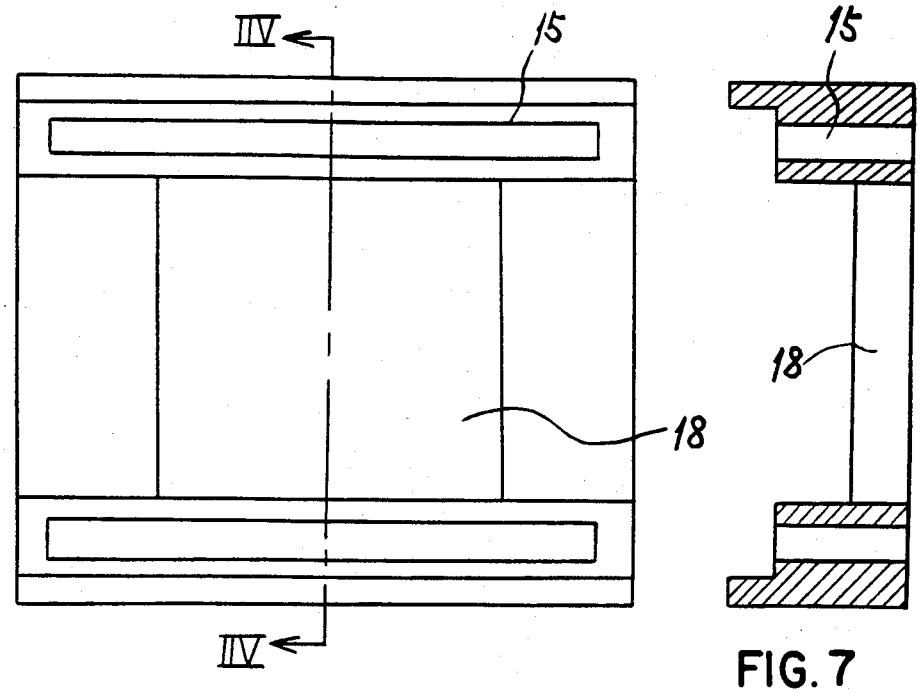
FIG. 6
FIG. 7
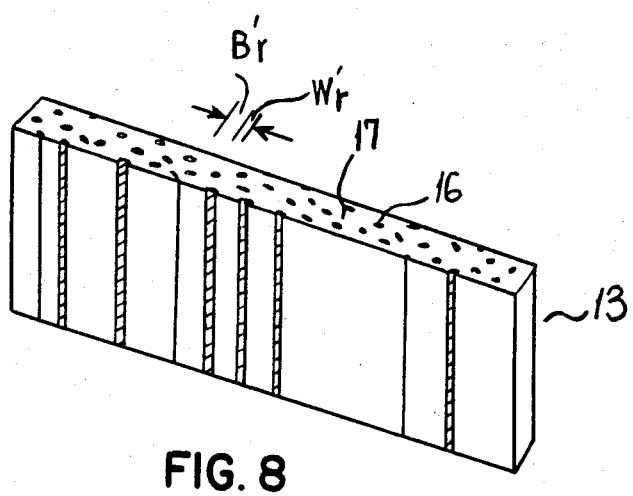
FIG. 8

RESILIENT INTERCONNECTION FOR EXCHANGEABLE LIQUID CRYSTAL PANEL

This is a continuation of application Ser. No. 379,002 filed on May 17, 1982, which is a continuation of Ser. No. 940,388 filed on Sept. 7, 1978, which is a continuation of Ser. No. 619,974 filed on Sept. 30, 1975, all three abandoned.

BACKGROUND OF THE INVENTION

The present invention relates to an exchangeable liquid crystal panel and, more particularly, to a compressible and resilient interconnection means for use in the exchangeable liquid crystal panel.

It is well known in the art that liquid crystal cells or composites essentially have only a limited operating life. It is, therefore, desired that the liquid crystal cells are detachably or removably mounted for maintenance or repair when they are incorporated into a display panel for use in electronic wristwatches or electronic calculators.

However, the liquid crystal panel has a multiplicity of contact or electrode areas, and thus requires much difficult technique for insuring that these electrode areas as held in electrical conducting relationship with a circuit board such as a printed circuit board and a ceramic substrate carrying a driver circuit thereon for the liquid crystal panel.

OBJECTS AND SUMMARY OF THE INVENTION

Accordingly, an object of the present invention is to provide an exchangeable liquid crystal panel.

Another object of the present invention is to provide a compressible and resilient interconnection means for establishing electrical connection between an exchangeable liquid crystal panel and a circuit board.

Still another object of the present invention is to provide a compressible and resilient interconnection means for not only insuring correct electrical connection between an exchangeable liquid crystal panel and a circuit board but also facilitating installation of the exchangeable liquid crystal panel on the circuit board.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objectives, pursuant to one embodiment of the present invention, a desired number of electrodes are provided on both a liquid crystal panel and a circuit board to confront each other. A compressible interconnection means comprising a stack including a multiplicity of compressible and resilient conductive regions made of, for example, conductive rubber and a multiplicity of compressible, resilient non-conductive regions made of, for example, rubber in alternating fashion is interposed between the liquid crystal panel and the circuit board to connect the corresponding electrodes with each other.

The section of the conductive region is made smaller than the distance provided between two adjacent electrodes on the liquid crystal panel and the circuit board, and the distance between two adjacent conductive regions is selected shorter than the width of the electrodes provided on the liquid crystal panel and the circuit board in order to insure correct electrical connection and facilitate the installation of the liquid crystal panel on the circuit board.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

FIG. 6 is a plan view of a housing for supporting the compressible, resilient interconnection means of FIG. 5;

FIG. 7 is a sectional view as seen at IIV—IIV of FIG. 6; and

FIG. 8 is a perspective view of another embodiment of the compressible, resilient interconnection means of the present invention.

DESCRIPTION OF THE PREFERRED EMBODIMENTS

Figure 1:
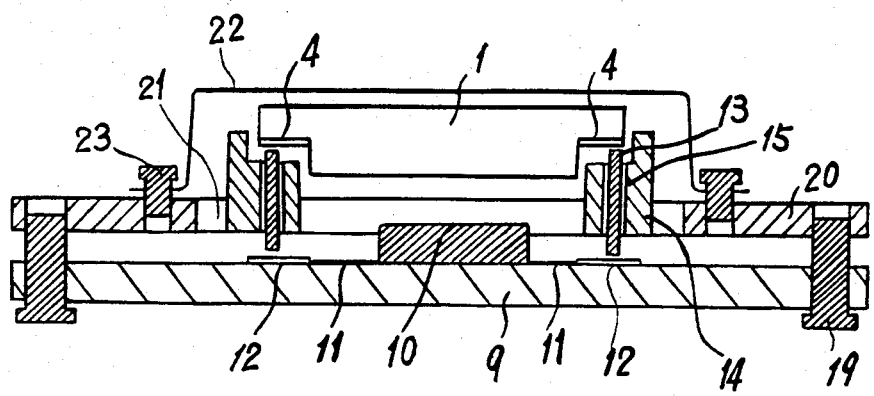
FIG. 1 is a sectional view of an electronic wristwatch including a liquid crystal cell, a ceramic substrate and a compressible, resilient interconnection means.

Referring now to FIG. 1, there is illustrated an electronic wristwatch including a liquid crystal cell 1, a ceramic substrate 9 and a compressible, resilient interconnection means 13 of the present invention.

The liquid crystal cell 1 comprises, as is well known in the art, a pair of glass substrates, liquid crystal composites interposed between the glass substrates, a pair of polarizers, a reflection plate, etc.

Figure 2:
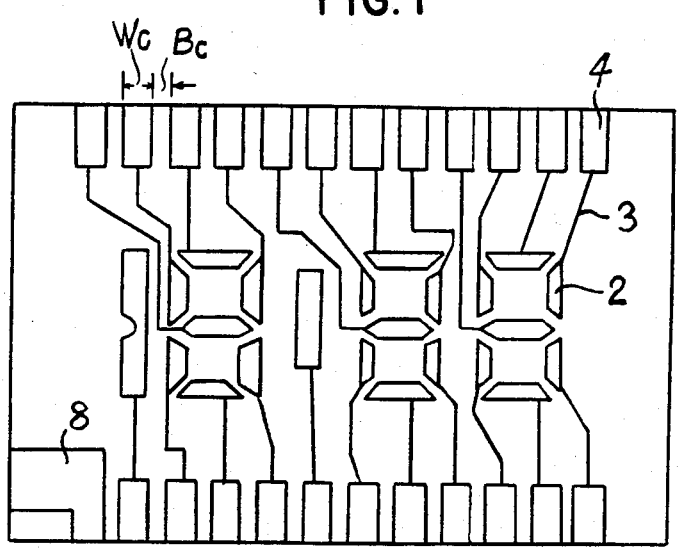
FIG. 2 is a plan view of a segment electrodes pattern of the liquid crystal cell.
Figure 3:
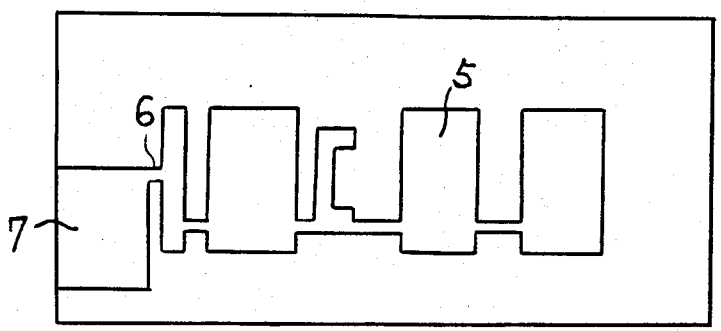
FIG. 3 is a plan view of a common electrode pattern of the liquid crystal cell.

The pair of glass substrates carry segment electrodes and a common electrode formed thereon, respectively. FIG. 2 shows a typical pattern of the segment electrodes formed on the upper glass substrate. Respective segment electrodes 2 are connected with input electrodes 4 via lead wires 3. FIG. 3 shows a typical pattern of the common electrode formed on the bottom glass substrate. A common electrode 5 is connected with a common input terminal 7 via a lead wire 6. The common input terminal 7 is connected with a common input electrode 8 formed on the upper glass substrate shown in FIG. 2 via a suitable connector (not shown) when the liquid crystal cell 1 is fabricated. It will be clear that all the necessary input electrodes 4 including the common input electrode 8 for driving the liquid crystal cell 1 are formed on the bottom surface of the upper glass substrate of the liquid crystal cell 1 and exposed outside for electrical connection at both ends of the liquid crystal cell 1 as shown in FIG. 1.

Figure 4:
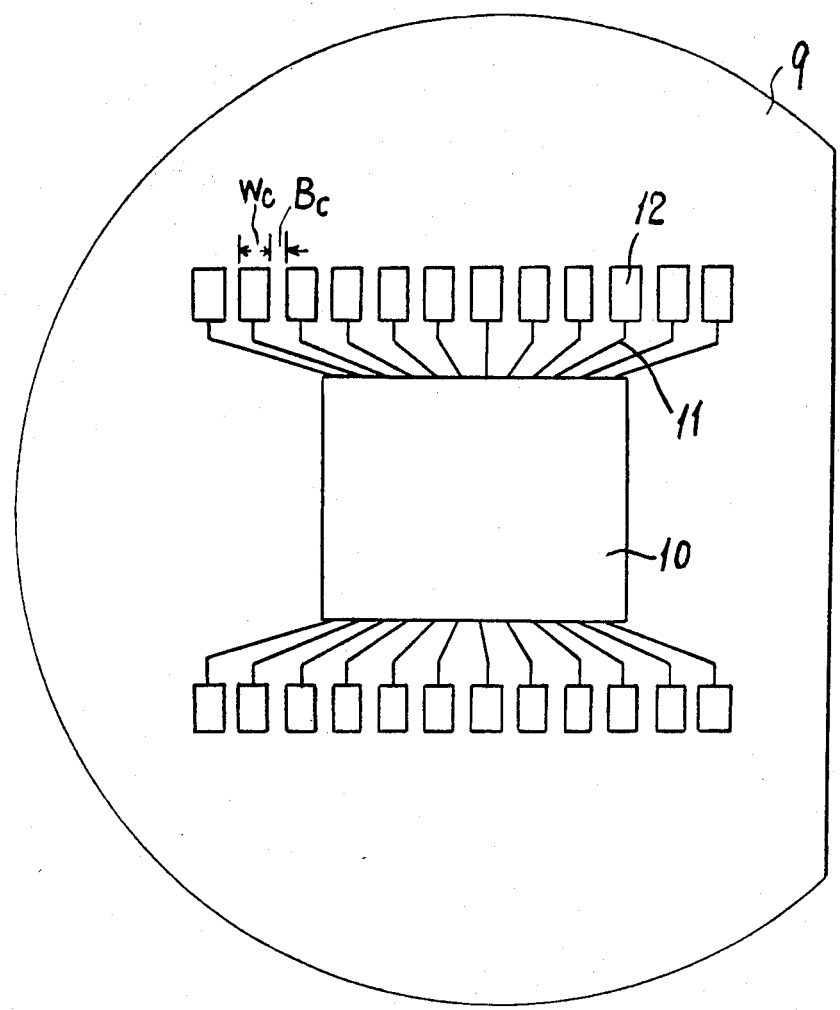
FIG. 4 is a plan view of an electrodes pattern formed on the ceramic substrate.

The ceramic substrate 9 carries a C-MOS IC for generating driving signals to be applied to the liquid crystal cell 1, the C-MOS IC being bonded onto the ceramic substrate 9 and covered or shielded by a metal plate 10. Respective output terminals of the C-MOS IC are connected with output electrodes 12 via lead wires 11 as shown in FIG. 4. The output electrodes 12 are formed at the positions corresponding to the input electrodes 4 including the common input electrode 8 formed on the bottom surface of the upper glass substrate of the liquid crystal cell 1.

The compressible and resilient interconnection means 13 are inserted into slits or gutters 15 provided on a housing 14 in order to connnect the output electrodes 12 formed on the ceramic substrate 9 with the corresponding input electrodes 4 including the common input electrode 8 formed on the bottom surface of the upper glass substrate of the liquid crystal cell 1. Such a compressible and resilient interconnection means is disclosed in our copending U.S. patent application Ser. No. 562,982 "EXCHANGEABLE LIQUID CRYSTAL PANEL" filed on Mar. 28, 1975, U.S. Pat. No. 4,142,780, which is incorporated hereto. The present invention is to improve the compressible, resilient interconnection means disclosed in the above-identified Patent Application.

Figure 5:
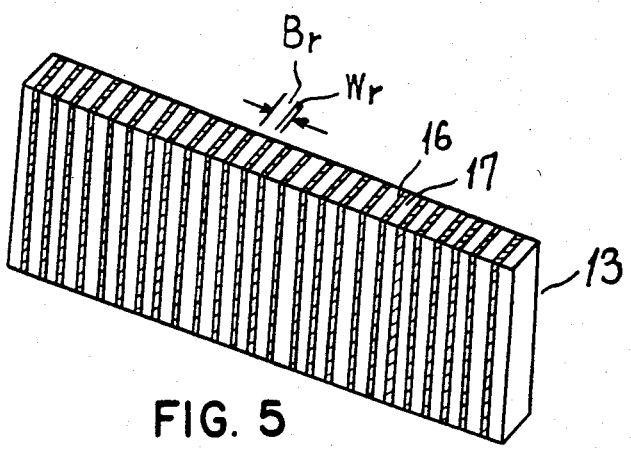
FIG. 5 is a perspective view of an embodiment of the compressible, resilient interconnection means of the present invention.

A typical construction of the compressible and resilient interconnection means 13 of the present invention is shown in FIG. 5. The compressible and resilient interconnection means 13 comprises a stack including a multiplicity of compressible and resilient conductive regions 16 made of conductive rubber, and a multiplicity of compressible and resilient non-conductive regions 17 made of rubber in an alternating fashion. A width $W_r$ of the conductive rubber 16 is selected narrower than a distance $B_c$ provided between the two adjacent input electrodes 4 shown in FIG. 2 or provided between the two adjacent output electrodes 12 shown in FIG. 4. A distance $B_r$ provided between two adjacent conductive rubbers 16, which is identical with a width of the rubber 17, is selected narrower than or equal to a width $W_c$ of the input electrodes 4 and the output electrodes 12.

FIGS. 6 and 7 show the housing 14 including the slits or gutters 15 for holding the compressible and resilient interconnection means 13, and an opening or a cutaway portion 18 at the center thereof in order to secure the C-MOS IC therein.

The ceramic substrate 9 is fixed to a supporting plate 20 via screws 19, whereas the housing 14 is mounted on the ceramic substrate 9 through an opening 21 provided at the center of the supporting plate 20. The compressible, resilient interconnection means 13 are inserted into the slits 15 provided on the housing 14 and, thereafter, the liquid crystal cell 1 is disposed on the housing 14. A cell cover 22 is fixed to the supporting plate 20 via screws 23, whereby the liquid crystal cell 1, the compressible, resilient interconnection means 13 and the ceramic substrate 9 are fixed with each other in a desired relationship. When the liquid crystal cell 1, the interconnection means 13 and the ceramic substrate 9 are installed in such a manner as described above, the input electrodes 4 including the common input electrode 8 formed on the bottom surface of the upper glass substrate of the liquid crystal cell 1 confront the output electrodes 12 formed on the ceramic substrate 9 and the corresponding electrodes are connected with each other via the conductive rubbers 16 included within the compressible, resilient interconnection means 13.

As described above, the width $W_r$ of the conductive rubber 16, the distance $B_c$ provided between two adjacent input electrodes 4 or output electrodes 12, the distance $B_r$ provided between two adjacent conductive rubbers 16, and the width $W_c$ of the input electrode 4 or the output electrode 12 are determined to satisfy the following conditions.

$$W_r < B_c$$

and $$B_r \leq W_c$$

Therefore, each of the conductive rubbers 16 contacts at least one portion of the electrodes 4 and 12 and never erroneously connects the two adjacent electrodes with each other. The compressible, resilient interconnection means 13 of the present invention correctly connect the corresponding electrodes 4 and 12 with each other even though the position of the interconnection means 13 is shifted with respect to the electrodes 4 and 12. This facilitates the installation of the interconnection means 13.

When a pitch $P_r$ ($=W_r+B_r$) of the conductive rubbers 16 is, in another preferred embodiment, determined to satisfy the condition $P_r + B_r \leq W_c$, the conductive rubbers 16 contact at least two portions of the electrodes 4 and 12. The electrical connection will be enhanced since the connection points are increased.

FIG. 8 shows another embodiment of the compressible, resilient interconnection means 13 of the present invention, wherein rod-like conductive rubbers 16 are supported by and randomly provided within a non-conductive rubber 17. In this embodiment a section $W_r'$ of the rod-like conductive rubber 16 and a distance $B_r'$ provided between two adjacent conductive rubbers 16 must be selected to satisfy the following conditions as the embodiment shown in FIG. 5.

$$W_r' < B_c$$

and $$B_r' \leq W_c$$

The invention being thus described, it will be obvious that the same may be varied in many ways. Such variations are not be regarded as a departure from the spirit and scope of the invention, and all such modifications are intended to be included within the scope of the following claims.

What is claimed is:

1. A display assembly comprising:
   a liquid crystal display cell having first and second planar substrates having a liquid crystal material disposed therebetween and a plurality of display electrodes having input electrodes connected thereto, uniformly spaced apart and coplanarly arranged;
   a support;
   drive means provided on said support for applying signals to said liquid crystal display cell, said drive means having coplanarly arranged output electrodes which subtend corresponding said input electrodes;
   compressible resilient interconnection means for interconnecting said output electrodes with said corresponding input electrodes, said interconnection means including:
   a multiplicity of compressible, resilient conductive rods extending from said output electrodes to said corresponding input electrodes; and a compressible, resilient non-conductive medium interposed between and enveloping adjacent conductive rods in the provision of an elongated configuration having a length and a rectangular cross section with a height dimension bridging said input and output electrodes substantially greater than a width dimension orthogonal thereto, said medium extending along said height dimension between said output electrodes and said corresponding input electrodes;

said elongated configuration having a first surface exposing first ends of said multiplicity of compressible resilient conductive rods to said input electrodes on said liquid crystal display cell and a second surface exposing the opposite ends of said multiplicity of compressible conductive rods to corresponding ones of said output electrodes of said drive means;

said compressible conductive rods each having a cross-sectional width which is selected narrower than the distance provided between adjacent electrodes on the liquid crystal display cell and circuit board and being randomly disposed throughout said non-conductive medium; and said non-conductive medium having a distance between adjacent said rods less than or equal to the width of the electrodes on the liquid crystal display cell and drive means, but greater than zero to thereby assure non-interfering conducting paths between said output electrodes and said corresponding input electrodes;

housing means provided on said support for constraining said liquid crystal display cell to inhibit movement thereof in the plane of said display substrates so that said input electrodes are subtended by said output electrodes, said housing means further including a support extending on both sides of the width dimension of said medium, said support defining a slot for receiving said compressible, resilient interconnection means and inhibiting the movement thereof in the plane of said display substrates, said slot being at least the length of said medium; and cover means affixed to said support for covering said display cell to compress said compressible resilient interconnection means to ensure positive contact between said output electrodes and said corresponding input electrodes.

2. The display assembly of claim 1 wherein each said compressible, resilient conductive rods is made of conductive rubber, and wherein said compressible, resilient non-conductive medium is made of non-conductive rubber.

3. The display assembly of claim 1 wherein said cover means applies pressure directly to said display cell.

* * * * *